US009819175B2

(12) United States Patent  
Dickey et al.

(10) Patent No.: US 9,819,175 B2  
(45) Date of Patent: Nov. 14, 2017

(54) CAPACITOR BASED LIGHTNING CLAMP

(71) Applicant: Hamilton Sundstrand Corporation, Charlotte, NC (US)

(72) Inventors: John A. Dickey, Caledonia, IL (US); Josh C. Swenson, Rockford, IL (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 33 days.

(21) Appl. No.: 14/845,375

(22) Filed: Sep. 4, 2015

(65) Prior Publication Data

US 2017/0070046 A1 Mar. 9, 2017

(51) Int. Cl.
*H02H 3/20* (2006.01)
*H02H 9/04* (2006.01)
*H05K 1/02* (2006.01)

(52) U.S. Cl.
CPC ........... *H02H 9/04* (2013.01); *H02H 9/041* (2013.01); *H02H 9/043* (2013.01); *H02H 9/046* (2013.01); *H05K 1/0259* (2013.01)

(58) Field of Classification Search
USPC .................................................. 361/56, 91.1
See application file for complete search history.

(56) References Cited

U.S. PATENT DOCUMENTS

| 6,226,162 B1 * | 5/2001 | Kladar | H02H 3/44 361/111 |
| 8,995,159 B1 * | 3/2015 | Carr | H02J 3/18 363/10 |
| 2006/0268475 A1 * | 11/2006 | Kerley | G01R 31/2844 361/56 |

* cited by examiner

*Primary Examiner* — Danny Nguyen  
(74) *Attorney, Agent, or Firm* — Cantor Colburn LLP

(57) ABSTRACT

A circuit comprises an alternating current (AC) feed line, a solid state power controller portion connected to the AC feed line, a load connected to the solid state power controller portion, a positive clamp rail, a negative clamp rail, a ground, a first diode connected to the AC feed line and the positive clamp rail, a second diode connected to the AC feed line and the negative clamp rail, a third diode connected to the load and the positive clamp rail, a fourth diode connected to the load and the negative clamp rail, a fifth diode connected to the positive clamp rail and the ground, a sixth diode connected to the negative clamp rail and the ground, and a capacitor connected to the positive clamp rail and the negative clamp rail.

16 Claims, 2 Drawing Sheets

CAPACITOR BASED LIGHTNING CLAMP

TECHNICAL FIELD

The present disclosure relates to electrical circuits, and particularly to an electrical circuit that provides protection from lightning.

BACKGROUND

Solid state power controllers (SSPC) often use power metal oxide semiconductor field effect transistor (MOSFET) devices to switch line voltages. When the MOSFETs are subjected to lightning that has a higher voltage than the voltage ratings of MOSFETs, while the MOSFETs are in an off state, the MOSFETs breakdown and conduct, which often causes the damage or destruction of the MOSFETS. Traditional protection for these circuits has been provided by tranzorbs or by control circuits that partially turn the MOSFETs on during a lightning event such that the transzorbs act as 'power zener diodes'.

SUMMARY

A circuit comprises an alternating current (AC) feed line, a solid state power controller portion connected to the AC feed line, a load connected to the solid state power controller portion, a positive clamp rail, a negative clamp rail, a ground, a first diode connected to the AC feed line and the positive clamp rail, a second diode connected to the AC feed line and the negative clamp rail, a third diode connected to the load and the positive clamp rail, a fourth diode connected to the load and the negative clamp rail, a fifth diode connected to the positive clamp rail and the ground, a sixth diode connected to the negative clamp rail and the ground, and a capacitor connected to the positive clamp rail and the negative clamp rail.

A circuit comprises an alternating current (AC) feed line, a solid state power controller portion connected to the AC feed line, a load connected to the solid state power controller portion, a positive clamp rail, a negative clamp rail, a ground, a first diode connected to the AC feed line and the positive clamp rail, a second diode connected to the AC feed line and the negative clamp rail, a third diode connected to the load and the positive clamp rail, a fourth diode connected to the load and the negative clamp rail, a first capacitor connected to the positive clamp rail and the ground, and a second capacitor connected to the negative clamp rail and the ground.

A method for connecting a load to a lightning clamping circuit comprises connecting a power input to the load, connecting the power input to a negative clamping rail with a first diode, and connecting the power input to a positive clamping rail with a second diode, wherein the negative clamping rail is connected to the positive clamping rail with a capacitor.

BRIEF DESCRIPTION OF THE DRAWINGS

Exemplary embodiments and features of the present disclosure will now be described by way of example only, and with reference to FIGS. 1 to 2, of which.

DETAILED DESCRIPTION

Previous circuits that protect against strikes by lightning used tranzorbs to clamp the voltage from the lightning before the voltage reaches the breakdown voltage of the metal oxide semiconductor field effect transistor (MOSFET) devices. Often tranzorbs or zener diodes are used to force the solid state power controller (SSPC) to a partially on state to pass a portion of the energy from the lightning to the load and dissipate the remaining energy from the lightning without exceeding the voltage rating of the MOSFET.

Figure 1:
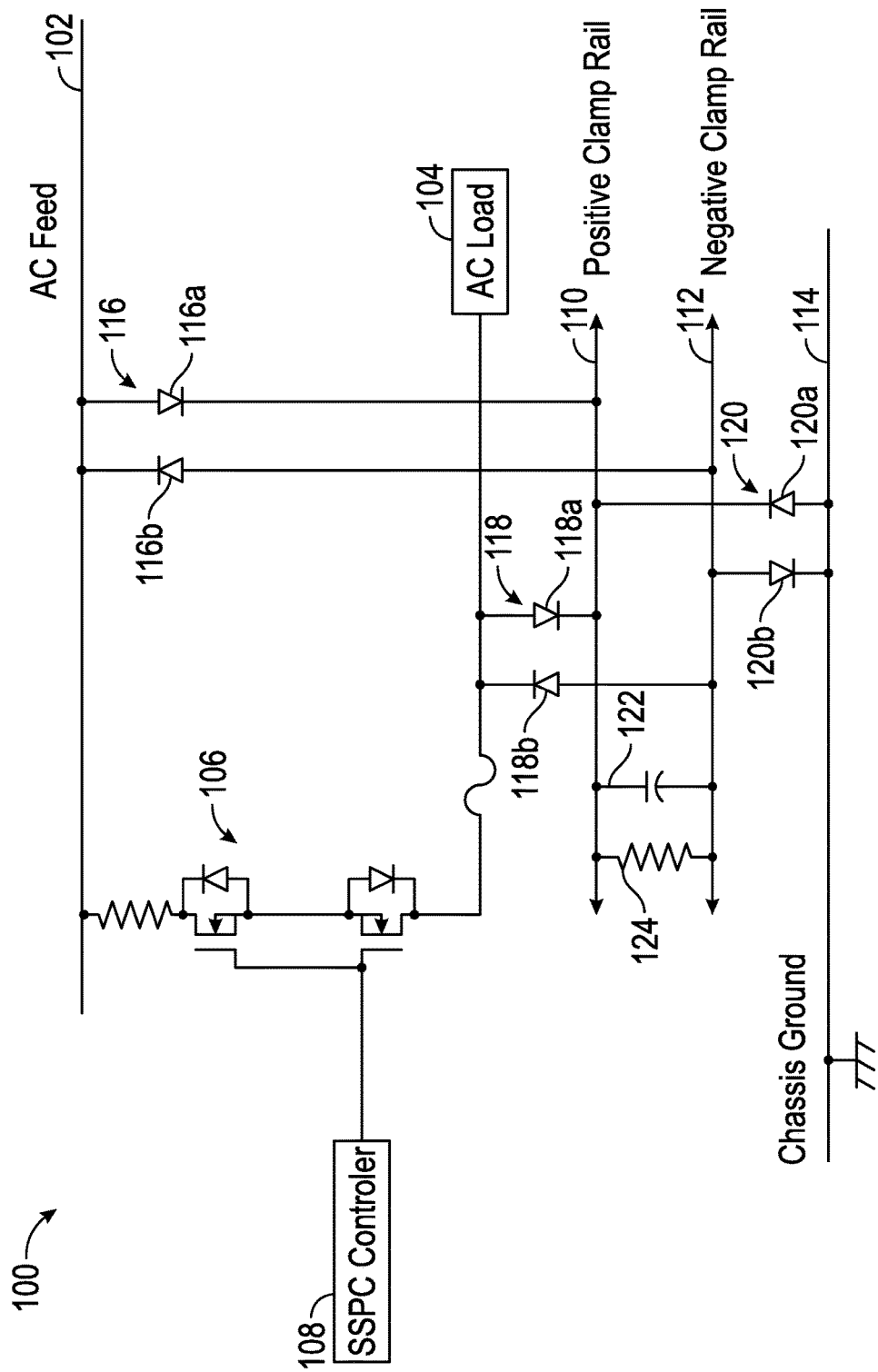
FIG. 1 illustrates a circuit diagram of an exemplary embodiment of a clamping circuit.

FIG. 1 illustrates a circuit diagram of an exemplary embodiment of a capacitor based lightning clamping circuit 100 that may be used in a vehicle such as, for example, an aircraft. The circuit 100 includes an alternating current (AC) feed 102 that provides a connection to an AC power source and to an AC load 104. The AC power to the AC load 104 is controlled by a solid state power controller (SSPC) portion 106 that is controlled by a SSPC controller 108. The circuit 100 includes a positive clamp rail 110, a negative clamp rail 112, and a ground rail 114 that is connected to ground.

In the illustrated embodiment, AC feed 102 is connected to the positive clamp rail 110 and the negative clamp rail 112 via a first pair of diodes 116. In this regard, the anode of the diode 116a is connected to the AC feed 102 and the cathode of the diode 116a is connected to the positive clamp rail 110. The cathode of the diode 116b is connected to the AC feed 102 and the anode of the diode 116b is connected to the negative clamp rail 112.

The SSPC portion 106 and the AC load 104 is connected to the positive clamp rail 110 and the negative clamp rail 112 via a pair of diodes 118. The anode of the diode 118a is connected to the AC load 104 and the cathode of the diode 118a is connected to the positive clamp rail 110. The cathode of the diode 118b is connected to the AC load 104 and the anode of the diode 118b is connected to the negative clamp rail.

The positive clamp rail 110 and the negative clamp rail 112 are connected to the ground rail 114 via a pair of diodes 120. The cathode of the diode 120a is connected to the positive clamp rail 110 and the anode of the diode 120a is connected to the ground rail 114. The anode of the diode 120b is connected to the negative clamp rail 112 and the cathode of the diode 120b is connected to the ground rail 114.

The positive clamp rail 110 is connected to the negative clamp rail 112 via a resistor 124 and a capacitor 122. The value of the capacitor 122 is determined by the formula energy=½C*V2, where V is a voltage below the damage rating for the MOSFETs in the SSPC portion 106 and C is the size of the capacitor 122 (or total capacitance of a capacitor bank) that stores the energy of the lightning pulse.

In operation, if lightning strikes the circuit, the diodes 116, 118, and 120 direct the energy of the lightning to the capacitor 122 such that the capacitor 122 charges and stores the energy from the lightning pulse. The capacitor 122 may then relatively slowly dissipate the stored energy through parallel resistance 124. One of ordinary skill in the art would understand that the circuit 100 also protects from other types of transient voltages besides lightning and operates in a similar manner when receiving any relatively high voltage pulse.

By arranging the capacitor 122 to connect the positive clamp rail 110 and the negative clamp rail 112, any number of additional circuits may be protected from a lightning pulse by the capacitor 122 if the additional circuits are connected to the positive clamp rail 110 and the negative clamp rail 112 using a pair of diodes arranged in a similar manner as the diodes 118. Thus, any number of additional circuits may be protected at a relatively low cost and weight by merely connecting the circuits to the positive clamp rail 110 and the negative clamp rail 112 via relatively inexpensive and light diodes 118.

Figure 2:
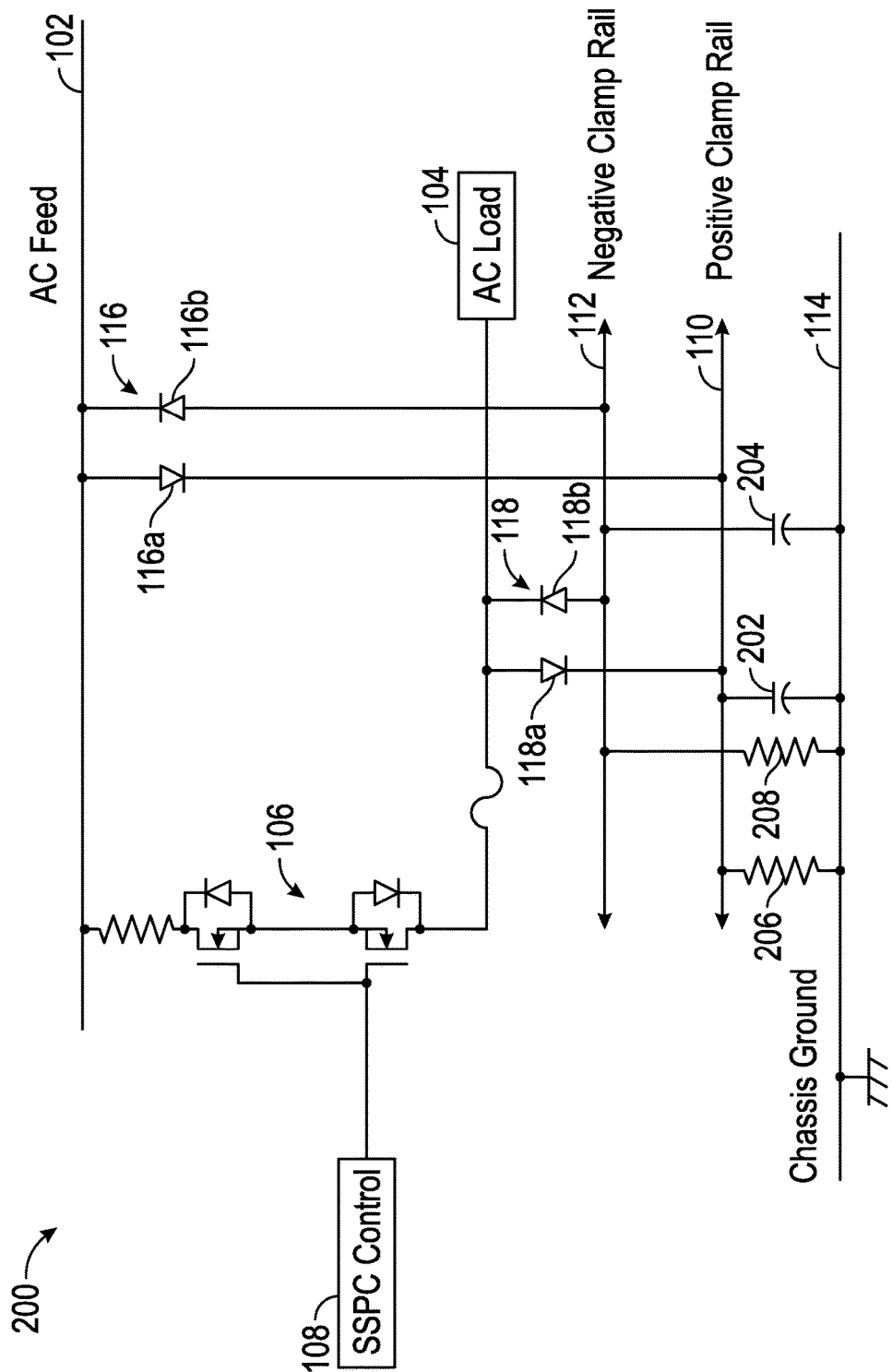
FIG. 2 a circuit diagram of another exemplary embodiment of a clamping circuit.

FIG. 2 illustrates an alternate exemplary embodiment of a capacitor based lightning circuit 200. The circuit 200 is similar to the circuit 100 (of FIG. 1) however, instead of having a capacitor 122 that connects the positive clamp rail 110 to the negative clamp rail 112 as shown in FIG. 1, the circuit 200 includes a first capacitor 202 that connects the positive clamp rail 110 to ground 114; a second capacitor 204 that connects the negative clamp rail 112 to ground 114; a resistor 206 that connects the positive clamp rail 110 to ground 114; and a resistor 208 that connects the negative clamp rail 112 to ground 114. The circuit 200 operates similarly to the circuit 100 described above however, the capacitors 202 and 204 discharge to ground 114 via the resistors 206 and 208.

The circuits and systems described above offer a benefit of protecting connected circuits from lightning pulses using capacitors and diodes. Any number of circuits or devices may be connected to the clamping circuits to provide protection from lightning pulses without adding costly or heavy components.

Although the figures and the accompanying description describe particular embodiments, it is to be understood that the scope of this disclosure is not to be limited to such specific embodiments, and is, instead, to be determined by the scope of the following claims.

What is claimed is:

1. A circuit comprising:
   an alternating current (AC) feed line;
   a solid state power controller portion connected to the AC feed line;
   a load connected to the solid state power controller portion;
   a positive clamp rail;
   a negative clamp rail;
   a ground;
   a first diode connected to the AC feed line and the positive clamp rail;
   a second diode connected to the AC feed line and the negative clamp rail;
   a third diode connected to the load and the positive clamp rail;
   a fourth diode connected to the load and the negative clamp rail;
   a fifth diode connected to the positive clamp rail and the ground;
   a sixth diode connected to the negative clamp rail and the ground; and
   a capacitor connected to the positive clamp rail and the negative clamp rail.

2. The circuit of claim 1, wherein an anode of the first diode is connected to the AC feed line.

3. The circuit of claim 1, wherein an anode of the second diode is connected to the negative clamp rail.

4. The circuit of claim 1, wherein an anode of the third diode is connected to the load.

5. The circuit of claim 1, wherein an anode of the fourth diode is connected to the negative clamp rail.

6. The circuit of claim 1, wherein an anode of the fifth diode is connected to the ground.

7. The circuit of claim 1, wherein an anode of the sixth diode is connected to the negative clamp rail.

8. The circuit of claim 1, further comprising a resistor connected to the negative clamp rail and the positive clamp rail.

9. The circuit of claim 1, wherein the solid state power control portion includes a metal oxide semiconductor field effect transistor device.

10. A circuit comprising:
    an alternating current (AC) feed line;
    a solid state power controller portion connected to the AC feed line;
    a load connected to the solid state power controller portion;
    a positive clamp rail;
    a negative clamp rail;
    a ground;
    a first diode connected to the AC feed line and the positive clamp rail;
    a second diode connected to the AC feed line and the negative clamp rail;
    a third diode connected to the load and the positive clamp rail;
    a fourth diode connected to the load and the negative clamp rail;
    a first capacitor connected to the positive clamp rail and the ground; and
    a second capacitor connected to the negative clamp rail and the ground.

11. The circuit of claim 10, wherein an anode of the first diode is connected to the AC feed line.

12. The circuit of claim 10, wherein an anode of the second diode is connected to the negative clamp rail.

13. The circuit of claim 10, wherein an anode of the third diode is connected to the load.

14. The circuit of claim 10, wherein an anode of the fourth diode is connected to the negative clamp rail.

15. The circuit of claim 10, further comprising a first resistor connected to the negative clamp rail and the ground.

16. The circuit of claim 10 further comprising a second resistor connected to the positive clamp rail and the ground.

* * * * *